United States Patent [19]

Fujisawa et al.

[11] Patent Number: 4,734,999
[45] Date of Patent: Apr. 5, 1988

[54] CYLINDER FOR METAL ORGANIC CHEMICAL VAPOR DEPOSITION

[75] Inventors: Masao Fujisawa, Houfu; Kazuhiro Morimasa, Shinnanyou, both of Japan

[73] Assignee: Toyo Stauffer Chemical Co., Ltd., Tokyo, Japan

[21] Appl. No.: 66,332

[22] Filed: Jun. 25, 1987

[30] Foreign Application Priority Data

Jul. 3, 1986 [JP] Japan ................................ 61-156655

[51] Int. Cl.$^4$ ............................................ F26B 17/10
[52] U.S. Cl. ....................................... 34/57 A; 261/122
[58] Field of Search ............. 34/57 A; 261/122, 121.1

[56] References Cited

U.S. PATENT DOCUMENTS

| | | | |
|---|---|---|---|
| 1,995,215 | 3/1935 | Mehlsen et al. | 261/121.1 |
| 3,925,024 | 12/1975 | Hollingsworth et al. | 34/57 A |
| 4,099,939 | 7/1978 | Vancheri et al. | 261/121.1 |
| 4,251,926 | 2/1981 | Bagley et al. | 34/57 A |
| 4,363,639 | 12/1982 | Gladon | 261/122 |
| 4,494,452 | 1/1985 | Barzso | 261/122 |
| 4,587,744 | 5/1986 | Huttlin | 34/57 A |
| 4,698,913 | 10/1987 | Voll | 34/57 A |

FOREIGN PATENT DOCUMENTS 59-151699 8/1984 Japan.
62-46639 3/1987 Japan.

Primary Examiner—Tim Miles
Attorney, Agent, or Firm—Oblon, Fisher, Spivak, McClelland & Maier

[57] ABSTRACT

A cylinder for metal organic chemical vapor deposition is disclosed, characterized in that, in the cylinder for metal organic chemical vapor deposition, wherein a throwing port for organometallic compound and an introducing port for inert gas are provided at the upper portion of cylinder, the inert gas being made to be charged into cylinder through a tube inserted into the cylinder and a distributor fitted at the lower end thereof, and an exhaust port for gas of organometallic compound and inert gas is provided at the upper portion of cylinder, the lower portion of the cylinder is made a narrow-diameter portion of reduced inside diameter compared with the upper portion of cylinder, the inside diameter of this narrow-diameter portion lying within a range from 1.1 times the diameter of distributor to $\frac{3}{4}$ of the inside diameter of upper portion of cylinder and the length of this narrow-diameter portion being 1.2 to 5 times the inside diameter of said narrow-diameter portion, and a slant portion is provided at the upside of said narrow-diameter portion.

1 Claim, 4 Drawing Sheets

Fig. 3
Fig. 4
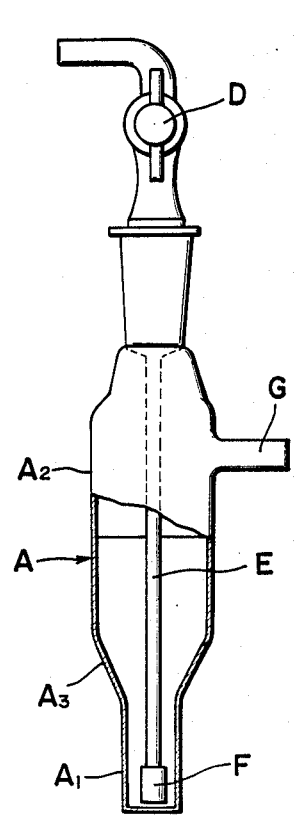
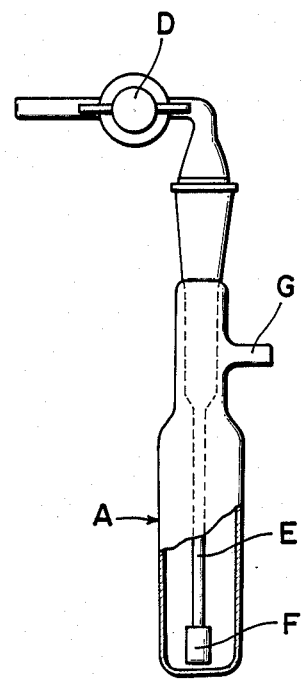

CYLINDER FOR METAL ORGANIC CHEMICAL VAPOR DEPOSITION

FIELD OF THE INVENTION

The present invention relates to a cylinder for metal organic chemical vapor deposition (hereinafter referred to as MO-CVD) of solid organometallic compounds used for semiconductors (hereinafter referred to as EGMA).

BACKGROUND OF THE INVENTION

Today, upon the manufacture of semiconductor laser etc., MO-CVD technique using organometallic compounds for raising the efficiency thereby is known well.

MO-CVD is to supply certain organometallic compound as a gas onto the wafer being at high temperature utilizing inert gas and to allow this gas to react on the wafer to deposit a thin film of single crystal of compound produced through this reaction.

In more detail, it is a method wherein, for example, gases of $(CH_3)_3Ga$ and $AsH_3$ are allowed to react on the wafer being at high temperature and thin film of single crystal of GaAs is deposited according to the reaction formula below:

$$(CH_3)_3Ga + AsH_3 \rightarrow GaAs + 3CH_4$$

In previous Japanese Patent Application No. Sho 60-219,680 (Japanese Unexamined Patent Publication No. Sho 62-83,400), the inventors made the invention that, in the cylinder for MO-CVD, a porous distributor with a pore size of 1 to $100\mu$ (hereinafter referred to as filter) was fitted to the lower end of the introducing tube for inert gas thereof (hereinafter referred to as dip tube).

In the case of liquid EGMA, extremely excellent result can be obtained by putting this invention into practice. However, in the cases of solid trimethylindium (referred to as TMIn), cyclopentadienylmagnesium (referred to as $Cp_2$ Mg) as a dopant and Cu-based EGMA, it was made clear that they were in solid form and the gases thereof were not ejected uniformly by conventional way resulting in the incapability of deposition of single crystal being uniform in composition.

There, as a result of extensive investigations, the inventors have found that, if utilizing such cylinder that the inside diameter of lower portion of cylinder is narrowed compared with the upper portion and a slant portion is provided at the upside of narrow-diameter portion, as shown in FIG. 1, excellent results can be obtained.

SUMMARY OF THE INVENTION

The gist of the invention lies in a cylinder for metal organic chemical vapor deposition characterized in that, in the cylinder for metal organic chemical vapor deposition wherein a throwing port for organometallic compound and an introducing port for inert gas are provided at the upper portion of cylinder, the inert gas being made to be charged into cylinder through a tube inserted into the cylinder and a distributor fitted at the lower end thereof, and an exhaust port for gas of organometallic compound and inert gas is provided at the upper portion of cylinder, the lower portion of cylinder is made a narrow-diameter portion of reduced inside diameter compared with the upper portion of the cylinder, the inside diameter of this narrow-diameter portion lying within a range from 1.1 times the diameter of distributor to ¾ of the inside diameter of upper portion of cylinder and the length of this narrow-diameter portion being 1.2 to 5 times the inside diameter of said narrow-diameter portion, and a slant portion is provided at the upside of said narrow-diameter portion.

BRIEF DESCRIPTION OF THE DRAWINGS

FIG. 3 and FIG. 4 are respective illustrating diagrams of the cylinder of an example of the invention and that of conventional example.

DETAILED DESCRIPTION OF THE INVENTION

When the cylinder of conventional example with uniform diameter shown in FIG. 4 was used, the filter was attached to the tip of dip tube, argon was introduced, and TMIn was placed to test, TMIn around the filter became hollow resulting in the incapability of obtaining uniform quantity of gas.

There, as a result of various tests, when test was made using the cylinder of the example of the invention shown in FIG. 3, wherein the inside diameter at narrow-diameter portion lay within a range from 1.1 times the diameter of filter to ¾ of the inside diameter of cylinder, the length of narrow-diameter portion was 1.2 to 5 times the inside diameter thereof, and the slant portion was provided at the upside of narrow-diameter portion, it was found that uniform quantity of gas could be obtained, the control of flow rate was easy, and therefore desired thin film of single crystal could be obtained on the wafer.

At that time, the slant angle is preferable to be between 10° and 40°, in particular, 20° and 30°.

Besides, the inside diameter of narrow-diameter portion may not be the same and the upper portion can be wider or narrower compared with the lower port. Moreover, whole of cylinder is not restricted to round shape. Furthermore, though a valve for combined use is used in the diagram, there is no relation whatever even if the introducing port for inert gas and the outlet for gas of organometallic compound are separate.

EXAMPLE

Figure 1:
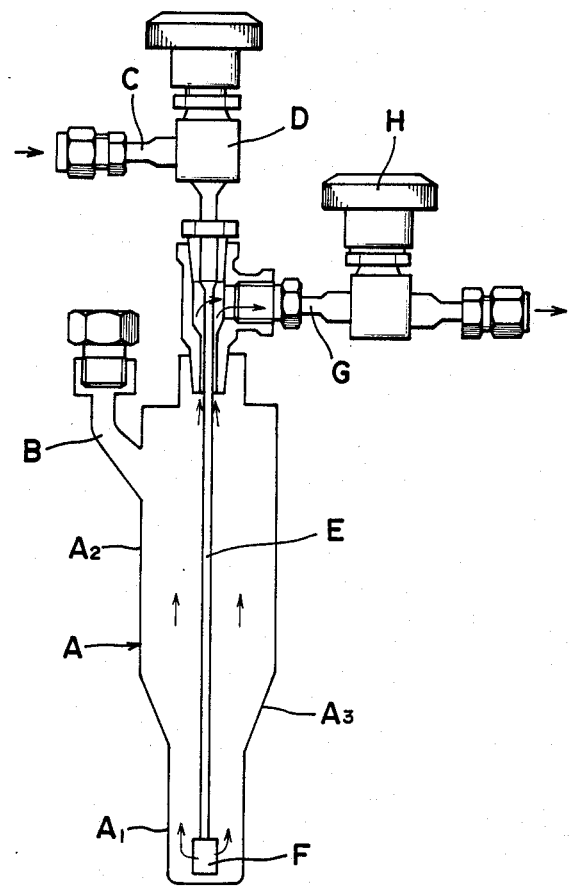
FIG. 1 is an illustrating diagram in front view of the cylinder for metal organic chemical vapor deposition of the invention.
Figure 2:
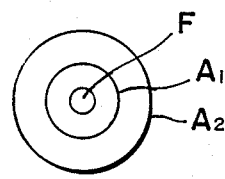
FIG. 2 is an illustrating diagram in plan view of the same.

FIG. 1 and FIG. 2 show the cylinder for metal organic chemical vapor deposition of the invention. At the upper portion of cylinder (A), there are throwing port (B) for organometallic compound and introducing port (C) for inert gas. The dip tube (introducing tube for inert gas) (E) communicating to this introducing part (C) through cock (D) is inserted into cylinder (A) from the upper portion thereof to near the bottom portion thereof. At the lower end of tube (E), the distributor (filter) (F) is provided so that the inert gas is charged into cylinder (A) through this distributor (F) as shown by arrow marks.

Moreover, at the upper portion of cylinder (A), the exhaust port (G) for gas of organometallic compound and inert gas is provided so that these gases are exhausted from exhaust port (G) through cock (H) as shown by arrow marks.

With this cylinder (A), the lower portion ($A_1$) thereof is made the narrow-diameter portion reduced the inside diameter thereof compared with the upper portion ($A_2$), the inside diameter of this narrow-diameter portion ($A_1$) being set up appropriately within a range from 1.1 times the diameter of distributor (F) to $\frac{3}{4}$ of the inside diameter of upper portion ($A_2$) of cylinder. In addition, the length of this narrow-diameter portion ($A_1$) is set up within a range of 1.2 to 5 times the inside diameter of this narrow-diameter portion ($A_1$). At the upside of this narrow-diameter portion ($A_1$), the slant portion ($A_3$) is provided successively and this slant portion ($A_3$) continues to the upper portion ($A_2$) of cylinder. The slant angle of this slant portion ($A_3$) is determined appropriately within a range of 10° to 40°, preferable 20° to 30°.

Next, in order to make the effect of the cylinder of the invention clear, comparative test with conventional cylinder was carried out.

As examples, glass cylinders shown in FIG. 3 (example of the invention) and FIG. 4 (conventional example) were made up. These were assembled into test device as in FIG. 5 and the flow test was made using TMIn as a sample.

The cylinder in FIG. 3 is same substantially as that in FIG. 1 and consists of narrow-diameter portion ($A_1$) at the lower portin, slant portion ($A_3$) and upper portion ($A_2$) with usual diameter. Whereas, the cylinder in FIG. 4 has uniform diameter being usual diameter both at upper portion and at lower portion.

Figure 5:
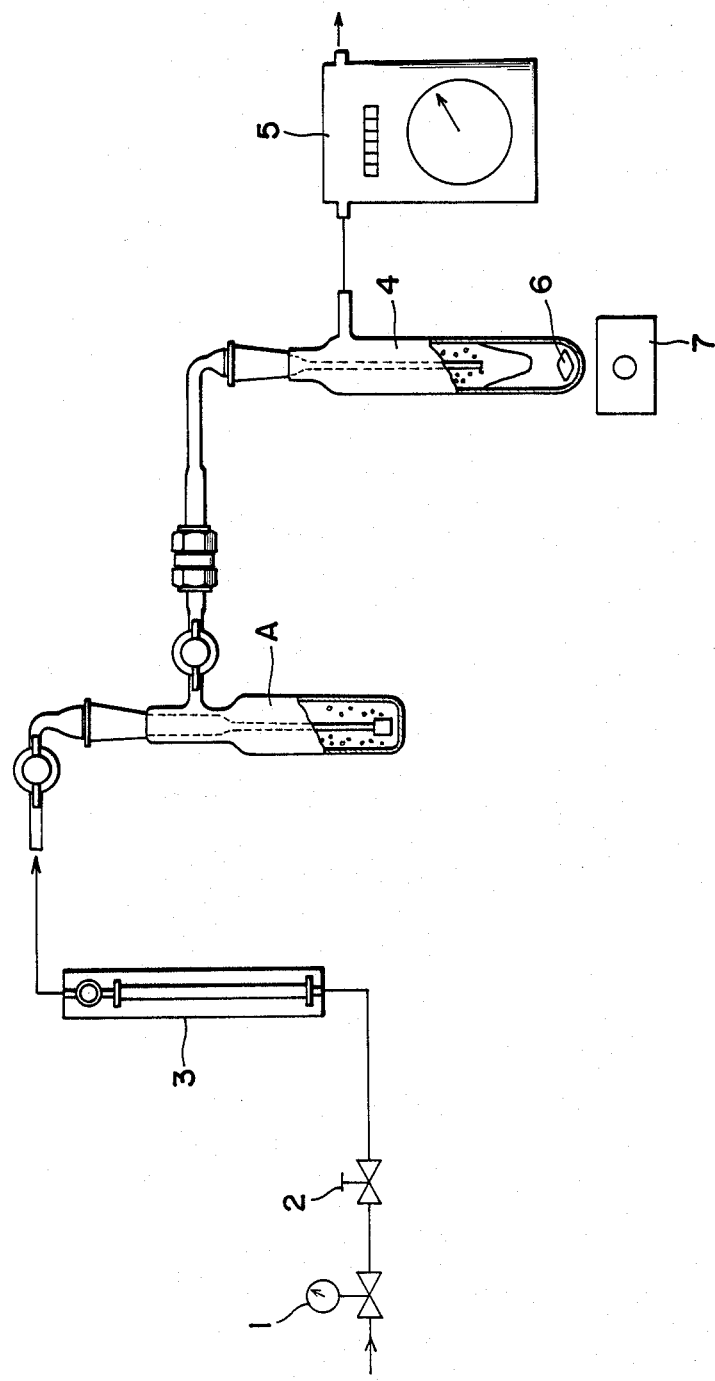
FIG. 5 is a systematic illustrating diagram of test device integrated the cylinder shown in FIG. 3 or FIG. 4.

In FIG. 5, argon is used as an inert gas, which is fed into cylinder A through pressure regulator 1, valve 2 and flow meter 3 attached with mass flow controller. At the bottom portion of cylinder A, TMIn is placed and, by introducing argon, gas of TMIn is allowed to eject.

In this system, the gas of TMIn is dissolved and absorbed into absorber 4 charged with n-hexane and 1N hydrochloric acid, the analysis thereof being conducted by the use of high-frequency plasma analyser, and the exhaust gas is exhausted after measured with wet-type gas meter 5. Numeral 6 is a teflon rotator and 7 is a magnet stirrer.

There, as the cylinder (A), each cylinder shown in FIG. 3 or FIG. 4 was fitted (in FIG. 5, the cylinder in FIG. 4 is exemplified). When plotting the state of ejection of TMIn gas varying the amount of TMIn from 5 to 50 g, results as shown in FIG. 6 were obtained.

Figure 6:
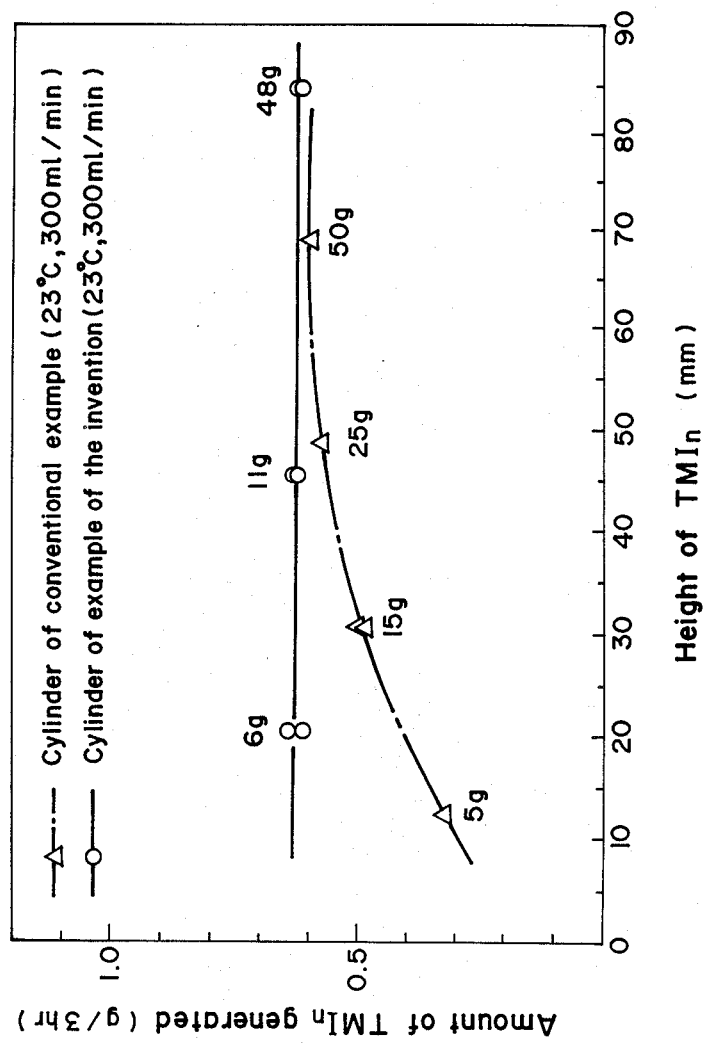
FIG. 6 is a graph showing the results of comparative test between the cylinder of the example of the invention and that of comparative example carried out using the test device shown in FIG. 5.

In FIG. 6, the abscissa indicates the height of TMIn (mm) in the cylinder and the ordinate indicates the ejected amount of gas (g) for 3 hours. Argon was used in amount of 300 ml/min., 23° C. in both cylinders shown in FIG. 3 and FIG. 4.

As a result, it was observed that, with the cylinder in FIG. 3 (example of the invention), TMIn was ejected almost uniformly, whereas, with that in FIG. 4 (conventional example), the ejection was ununiform, as evident from FIG. 6.

With respect to the size of narrow-diameter portion of the cylinder in FIG. 3, the inside diameter thereof was twice the diameter of filter and $\frac{1}{2}$ of the inside diameter of cylinder, and the height thereof was 2.5 times the inside diameter of narrow-diameter portion. Moreover, the angle at the slant portion was 30°.

What is claimed is:

1. A cylinder for metal organic chemical vapor deposition characterized in that, in the cylinder for metal organic chemical vapor deposition wherein a throwing port for organometallic compound and an introducing port for inert gas are provided at the upper portion of the cylinder, the inert gas being made to be charged into the cylinder through a tube inserted into the cylinder and a distributor fitted at the lower end thereof, and an exhaust port for gas of organometallic compound and inert gas is provided at the upper portion of the cylinder, the lower portion of the cylinder is made a narrow-diameter portion of reduced inside diameter compared with the upper portion of the cylinder, the inside diameter of this narrow-diameter portion lying within a range from 1.1 times the diameter of the distributor to $\frac{3}{4}$ of the inside diameter of the upper portion of the cylinder and the length of this narrow-diameter portion being 1.2 to 5 times the inside diameter of said narrow-diameter portion, and a slant portion is provided at the upside of said narrow-diameter portion.

* * * * *